United States Patent
Ehira et al.

(10) Patent No.: US 9,334,559 B2
(45) Date of Patent: May 10, 2016

(54) POWDER, SINTERED BODY AND SPUTTERING TARGET, EACH CONTAINING ELEMENTS OF CU, IN, GA AND SE, AND METHOD FOR PRODUCING THE POWDER

(75) Inventors: Masaya Ehira, Hyogo (JP); Akira Nambu, Hyogo (JP); Shigeo Kashiwai, Hyogo (JP); Masafumi Fukuzumi, Hyogo (JP)

(73) Assignees: KOBELCO RESEARCH INSTITUTE, INC., Kobe-shi (JP); HYOGO PREFECTURE, Kobe-shi (JP)

( * ) Notice: Subject to any disclaimer, the term of this patent is extended or adjusted under 35 U.S.C. 154(b) by 630 days.

(21) Appl. No.: 13/807,538

(22) PCT Filed: Jun. 27, 2011

(86) PCT No.: PCT/JP2011/064713
§ 371 (c)(1),
(2), (4) Date: Dec. 28, 2012

(87) PCT Pub. No.: WO2012/002337
PCT Pub. Date: Jan. 5, 2012

(65) Prior Publication Data
US 2013/0098758 A1    Apr. 25, 2013

(30) Foreign Application Priority Data
Jun. 29, 2010  (JP) ................................ 2010-147618

(51) Int. Cl.
| | | |
|---|---|---|
| C01B 19/00 | (2006.01) | |
| B22F 9/08 | (2006.01) | |
| C23C 14/14 | (2006.01) | |
| C04B 35/547 | (2006.01) | |
| C04B 35/626 | (2006.01) | |
| C04B 35/645 | (2006.01) | |
| C22C 1/04 | (2006.01) | |
| C22C 9/00 | (2006.01) | |
| C22C 28/00 | (2006.01) | |
| C23C 14/06 | (2006.01) | |
| C23C 14/34 | (2006.01) | |
| C22C 30/00 | (2006.01) | |
| C22C 30/02 | (2006.01) | |

(52) U.S. Cl.
CPC .............. *C23C 14/14* (2013.01); *C01B 19/002* (2013.01); *C04B 35/547* (2013.01); *C04B 35/62655* (2013.01); *C04B 35/645* (2013.01); *C22C 1/0491* (2013.01); *C22C 9/00* (2013.01); *C22C 28/00* (2013.01); *C22C 30/00* (2013.01); *C22C 30/02* (2013.01); *C23C 14/0623* (2013.01); *C23C 14/3414* (2013.01); *C01P 2002/72* (2013.01); *C01P 2002/85* (2013.01); *C01P 2004/61* (2013.01); *C04B 2235/40* (2013.01); *C04B 2235/407* (2013.01); *C04B 2235/446* (2013.01); *C04B 2235/656* (2013.01); *C04B 2235/77* (2013.01)

(58) Field of Classification Search
None
See application file for complete search history.

(56) References Cited

U.S. PATENT DOCUMENTS

| | | | | |
|---|---|---|---|---|
| 5,985,691 | A * | 11/1999 | Basol | ................ H01L 31/0322 257/E31.007 |
| 9,103,000 | B2 * | 8/2015 | Munteanu | ............. C04B 35/547 |

FOREIGN PATENT DOCUMENTS

| | | |
|---|---|---|
| JP | 3249408 | 1/2002 |
| JP | 2008 163367 | 7/2008 |
| JP | 2009 287092 | 12/2009 |
| JP | 2011 042537 | 3/2011 |
| WO | WO 2011/148600 A1 | 12/2011 |

OTHER PUBLICATIONS

Unno, T., et al., "Sputtering target for compound solar cell (Kagobutsu Taiyo Denchi-yo Sputter Target)," Electronic Materials and Parts, vol. 48, No. 11, pp. 42-44 and 96, (Nov. 1, 2009).
International Search Report Issued Sep. 13, 2011 in PCT/JP11/64713 Filed Jun. 27, 2011.
Extended Search Report issued Jun. 12, 2015 in European Patent Application No. 11800801.0.
N. Benslim, et al., "XRD and TEM characterizations of the mechanically alloyed CuIn0.5Ga0.5Se2 powders", Journal of Alloys and Compounds, vol. 489, 2010, pp. 437-440.
Unno, T., et al., "Sputtering target for compound solar cell (Kagobutsu Taiyo Denchi-yo Sputter Target)," Electronic Materials and Parts, vol. 48, No. 11, Nov. 1, 2009, pp. 42-44 and 96 (previously filed on Dec. 28, 2012, submitting partial English language translation only).

* cited by examiner

*Primary Examiner* — George Wyszomierski
(74) *Attorney, Agent, or Firm* — Oblon, McClelland, Maier & Neustadt, L.L.P

(57) ABSTRACT

The present invention provides a Cu—In—Ga—Se powder containing Cu, In, Ga and Se in which cracks do not occur during sintering or processing, and a sintered body and sputtering target, each using the same. The present invention relates to a powder containing Cu, In Ga and Se, which contains a Cu—In—Ga—Se compound and/or a Cu—In—Se compound in an amount of 60 mass % or more in total. The powder of the present invention preferably contains an In—Se compound in an amount of 20 mass % or less and/or a Cu—In compound in an amount of 20 mass % or less.

18 Claims, 3 Drawing Sheets

POWDER, SINTERED BODY AND SPUTTERING TARGET, EACH CONTAINING ELEMENTS OF CU, IN, GA AND SE, AND METHOD FOR PRODUCING THE POWDER

TECHNICAL FIELD

The present invention relates to a powder, a sintered body and a sputtering target, each containing elements of Cu, In, Ga and Se, which are suitably used for forming a light-absorbing layer of a solar cell, and a method for producing a powder containing elements of Cu, In, Ga and Se.

BACKGROUND ART

A method of forming a Cu—In—Ga—Se compound film by laminating a Cu—Ga film and an In film, which are formed by sputtering, and heat-treating the obtained laminated film in a gas atmosphere containing Se has conventionally been used to form a light-absorbing layer of a CIGS type thin film solar cell (for example, Patent Document 1). However, in the film formation method, the respective film formation chambers of a Cu—Ga binary alloy and In, and sputtering target materials are necessary, and a heat-treating furnace is further necessary for conducting heat treatment in a Se atmosphere. Thus, production costs were high.

In view of the above, development of a printing method using a Cu—In—Ga—Se compound powder, a deposition method using a Cu—In—Ga—Se compound or a sputtering method using a Cu—In—Ga—Se compound sputtering target material is being performed to efficiently form a Cu—In—Ga—Se compound film. However, when a Cu—In—Ga—Se compound is tried to be prepared by the conventional powder sintering method (for example, a method of preparing the respective powders of Cu, In, Ga and Se, and then sintering) or a melt casting method, there was a danger that In rapidly reacts with Se simultaneously with melting of In, and explosion occurs. To avoid the danger, for example, Patent Document 2 discloses a method for producing a Cu—In—Ga—Se quaternary compound molten metal by introducing Cu in Se to prepare a Cu—Se binary alloy molten metal, introducing In in the Cu—Se binary alloy molten metal to prepare a Cu—Se—In ternary compound molten metal, and introducing Ga in the Cu—Se—In ternary compound molten metal obtained. However, even in this method, there is a possibility of explosion such that if Se remains as a single phase in the Cu—Se binary alloy molten metal, Se rapidly reacts with In, and there is still room for improvement in safety and stability. Furthermore, for example, Patent Document 3 discloses a method for preparing a hot-pressed body by preparing a Cu—Se binary alloy powder, a Cu—In binary alloy powder, Cu—Ga binary alloy powder and a Cu—In—Ga ternary alloy powder, mixing those powders, and hot-pressing the resulting mixture. This method is a method of simultaneously conducing making in the form of a compound and sintering by hot-pressing a mixed powder. Therefore, considering that a gas is generated in a chamber when making in the form of a compound, a temperature of a hot press cannot be increased so much (for example, about 140° C.). As a result, there is high possibility that relative density of a hot-pressed body obtained cannot be increased and mechanical strength is insufficient, or cracks occur during hot-pressing or during processing after hot-pressing.

PRIOR ART DOCUMENTS

Patent Document

Patent Document 1: Japanese Patent No. 3249408
Patent Document 2: JP-A-2008-163367
Patent Document 3: JP-A-2009-287092

SUMMARY OF THE INVENTION

Problems that the Invention is to Solve

The present invention has been made in view of the above problems, and an object thereof is to provide a powder containing elements of Cu, In, Ga and Se, suitable for forming a CIGS thin film without involving the danger of explosion and the like, and a method for producing the same, and further provide a powder containing elements of Cu, In, Ga and Se, free from occurrence of cracks during sintering or processing, and a sintered body and a sputtering target, each using the same.

Means for Solving the Problems

The present invention provides the following powder, sintered body, sputtering target, and method for producing the powder.

[1] A powder containing elements of Cu, In, Ga and Se, which contains a Cu—In—Ga—Se compound and/or a Cu—In—Se compound in an amount of 60 mass % or more in total.

[2] The powder according to [1], which contains an In—Se compound in an amount of 20 mass % or less and/or a Cu—In compound in an amount of 20 mass % or less.

[3] The powder according to [1], wherein when a total amount of Cu, In, Ga and Se in the powder is 100 atomic %, the powder contains:
Cu: 20 atomic % or more and 30 atomic % or less,
In: 10 atomic % or more and 25 atomic % or less,
Ga: 0.1 atomic % or more and 15 atomic % or less, and
Se: 40 atomic % or more and 60 atomic % or less.

[4] The powder according to [2], wherein when a total amount of Cu, In, Ga and Se in the powder is 100 atomic %, the powder contains:
Cu: 20 atomic % or more and 30 atomic % or less,
In: 10 atomic % or more and 25 atomic % or less,
Ga: 0.1 atomic % or more and 15 atomic % or less, and
Se: 40 atomic % or more and 60 atomic % or less.

[5] A method for producing the powder according to any one of [1] to [4], which includes:
(1) a first step of atomizing a molten metal of a Cu-based alloy containing In and Ga to obtain a powder containing elements of In, Ga and Cu,
(2) a second step of mixing a Se powder with the powder containing elements of In, Ga and Cu to obtain a mixed powder,
(3) a third step of heat-treating the mixed powder to obtain a reactant containing a Cu—In—Ga—Se compound and/or a Cu—In—Se compound, and
(4) a fourth step of pulverizing the reactant obtained in the third step to obtain a powder containing element of Cu, In, Ga and Se.

[6] The production method according to [5], wherein an average particle size of the Se powder is from 0.1 to 10 μm.

[7] The production method according to [5], wherein a heat treatment temperature in the third step is 500° C. or higher and 1,000° C. or lower.

[8] The production method according to [6], wherein a heat treatment temperature in the third step is 500° C. or higher and 1,000° C. or lower.

[9] A sintered body containing elements of Cu, In, Ga and Se, which contains a Cu—In—Ga—Se compound and/or a Cu—In—Se compound in an amount of 60 mass % or more in total.

[10] The sintered body according to [9], which contains an In—Se compound in an amount of 20 mass % or less and/or a Cu—In compound in an amount of 20 mass % or less.

[11] A sputtering target containing elements of Cu, In, Ga and Se, which contains a Cu—In—Ga—Se compound and/or a Cu—In—Se compound in an amount of 60 mass % or more in total.

[12] The sputtering target according to [11], which contains an In—Se compound in an amount of 20 mass % or less and/or a Cu—In compound in an amount of 20 mass % or less.

[13] The sputtering target according to [12], wherein an area ratio of an In compound having an In content of 36 mass % or more is 10% or less in EPMA mapping analysis in a range of 0.24 mm×0.24 mm on a surface of the sputtering target.

[14] The sputtering target according to any one of [11] to [13], which has a relative density of 90% or more.

Advantages of the Invention

According to the production method of the present invention, a powder containing elements of Cu, In, Ga and Se can be produced without involving the danger of explosion and the like. Furthermore, in the powder of the present invention, a compound phase contained in the powder is suitably adjusted. Therefore, the sintered body and the sputtering target, each using the powder, can reduce cracks during sintering or in the course of processing.

EMBODIMENTS FOR CARRYING OUT THE INVENTION

Figure 1:
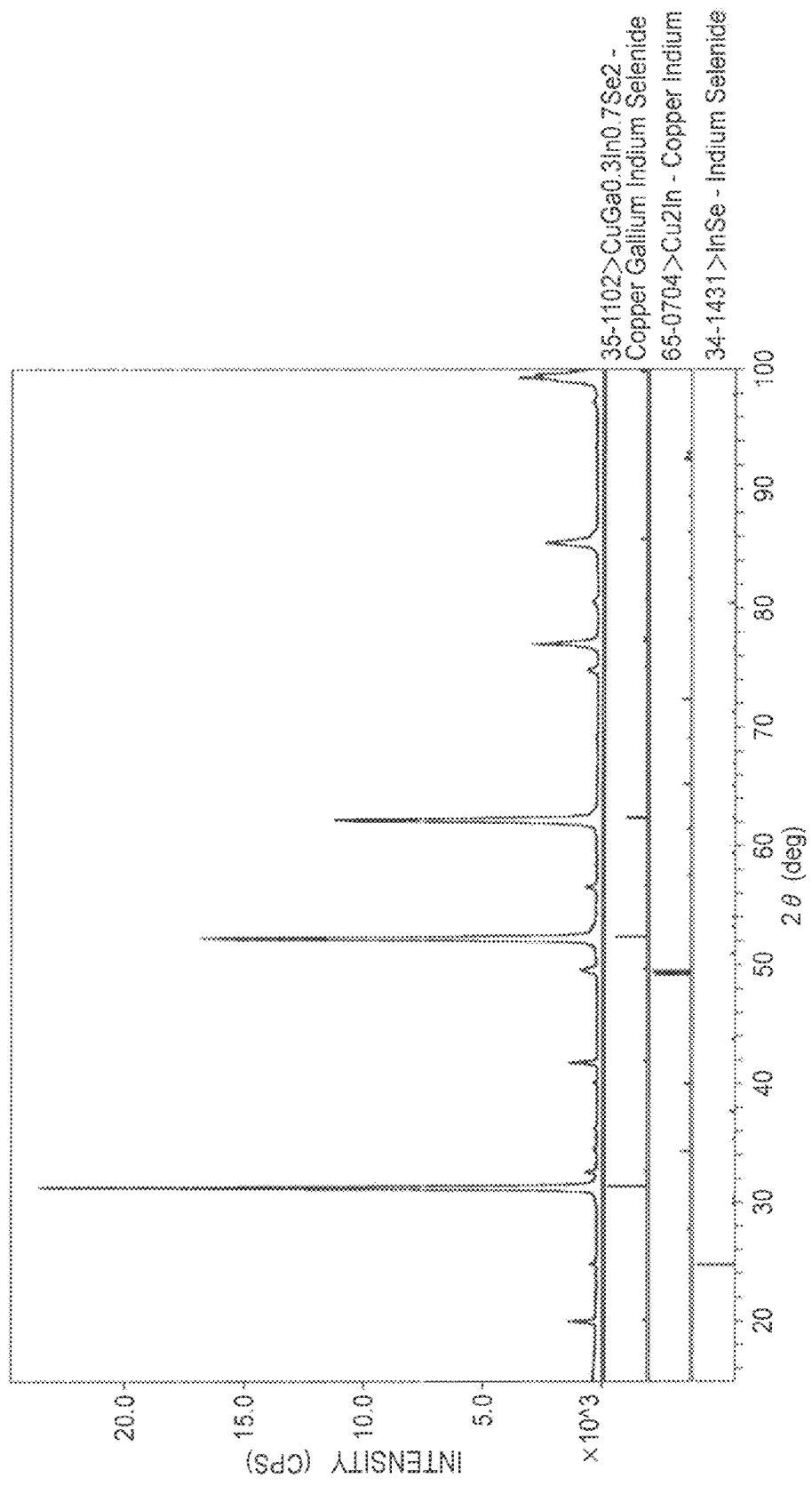
FIG. 1 is a graph showing a X-ray diffraction result of the Cu—In—Ga—Se powder of Example (Test Example 1) described hereinafter.
Figure 2:
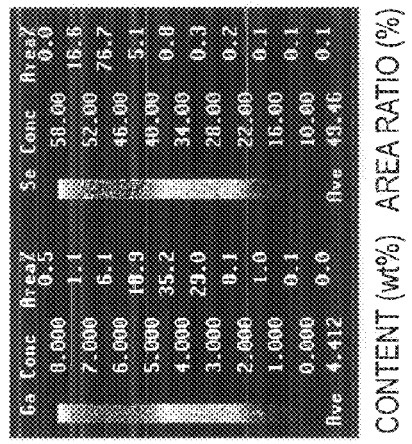
FIGS. 2(a) to (f) are views showing EMPA mapping analysis results of the Cu—In—Ga—Se sputtering target of Example (Test Example 1) described hereinafter.
Figure 2:
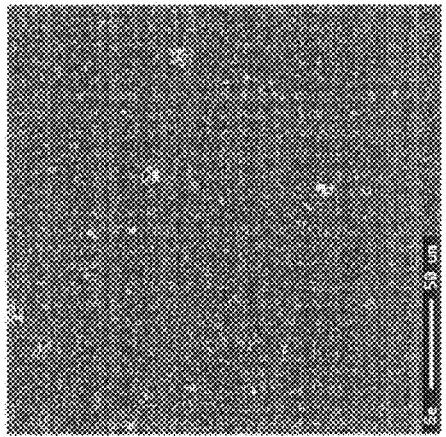
Figure 2:
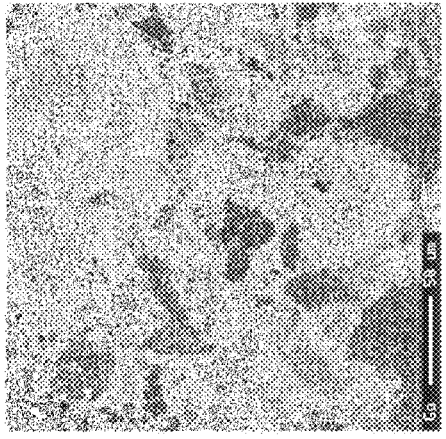
Figure 2:
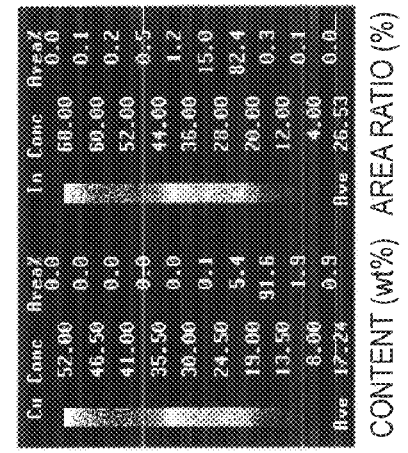
Figure 2:
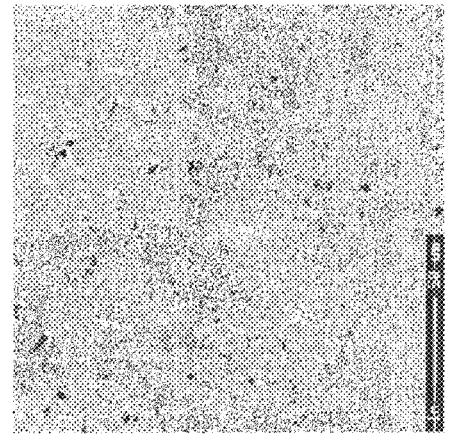
Figure 2:
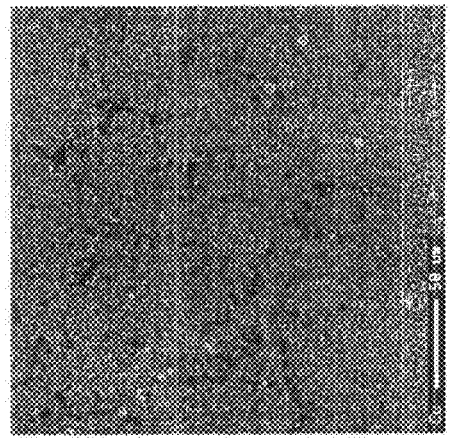

The present inventors have made investigations to prepare a powder containing Cu, In, Ga and Se without occurrence of explosion by an exothermic reaction between In and Se. As a result, it was clarified that if a ternary powder containing Cu, In and Ga (hereinafter referred to as a "Cu—In—Ga powder") is previously prepared by an atomizing method to incorporate an In phase in the powder, and the Cu—In—Ga powder and a Se powder are subjected to heat treatment, contact area between In and Se can be decreased and rapid exothermic reaction by direct contact is suppressed, thereby gradually conducting reaction, and as a result, a reactant containing elements of Cu, In, Ga and Se can safely be obtained and by pulverizing the reactant, a powder containing Cu, In, Ga and Se is obtained. It was further clarified that the powder obtained by the production method of the present invention can reduce cracks during sintering or in the course of processing. The production method and powder of the present invention are described below in that order.

The production method of the present invention includes the following four steps.

First Step

In a first step, a Cu-based alloy containing In and Ga (an alloy containing In and Ga, the remainder being Cu and unavoidable impurities (for example, C (carbon), N (nitrogen) and O (oxygen)) is heated to its melting point or higher (about 900 to 1200° C.) to obtain a molten metal, the molten metal is flown down from a nozzle, a gas (for example, an inert gas such as nitrogen) is sprayed to the molten metal from the surrounding, and atomization is performed. By conducting the atomization with a gas, a Cu—In—Ga powder rapidly solidified to semi-molten state→semi-coagulated state→solid phase can be obtained. When an average particle size (median diameter of a sphere equivalent diameter of entire fine particles obtained) of the Cu—In—Ga powder obtained in the first step is 200 μm or less, crystal structure in the powder can be refined, and as a result, an average grain size of a sputtering target can further be decreased, and strength can be improved, which is preferred. Furthermore, to reduce uneven mixing with a Se powder in the subsequent second step and to adjust a compound phase constituting a powder containing elements of Cu, In, Ga and Se (hereinafter referred to as a "Cu—In—Ga—Se powder") to be finally obtained to a desired compound phase, it is more preferred that an average particle size of the Cu—In—Ga powder is from 1 to 50 μm. For this reason, it is preferred that a particle size is decreased to fall in the above range (1 to 50 μm) by pulverizing an atomized powder or sieving the powder. To make the Cu—In—Ga powder have an average particle size of 200 μm or less as described above, for example, a melting temperature of the Cu-based alloy is suitably adjusted to about 900° C., a gas pressure is suitably adjusted to about 50 kg/cm$^2$, and a nozzle diameter is suitably adjusted to about 2.0 mm. The Cu—In—Ga powder contains a Cu—In—Ga compound and further contains In single phase. Furthermore, the composition of the Cu-based alloy is appropriately adjusted such that the Cu—In—Ga powder has the composition of Cu: 40 to 60 atomic %, In: 30 to 50 atomic % and Ga: 0.2 to 20 atomic %, based on the total amount of Cu, In and Ga.

Second Step

In a second step, the Cu—In—Ga powder obtained in the first step and a Se powder are mixed to obtain a mixed powder. The mixing ratio in atomic ratio of the Se powder is preferably equivalent to or more than the total amount of elements of Cu, In and Ga in the Cu—In—Ga powder, and is appropriately adjusted such that the Cu—In—Ga—Se powder to be finally obtained has the composition as described hereinafter. The Se powder reduces uneven mixing with the Cu—In—Ga powder and further adjusts a compound phase constituting the Cu—In—Ga—Se powder to be finally obtained to a desired compound phase. Therefore, 0.1 to 10 μm is preferred and 0.1 to 5 μm is more preferred. A mixing machine used in the second step is preferably a mixing machine with small uneven mixing, and for example, a V-type mixing machine can be used. Mixing time is generally from 15 minutes to 2 hours.

Third Step

In a third step, the mixed powder obtained in the second step is heat-treated to conduct a reaction, thereby obtaining a reactant containing a Cu—In—Ga—Se compound and/or a Cu—In—Se compound (hereinafter referred to as a "Cu—In—Ga—Se reactant"). The heat treatment can be conducted in an inert gas atmosphere such as Ar using, for example, a tubular electric furnace. Heating pattern of the heat treatment is preferably that after holding at a temperature of 400° C. or lower for 30 minutes or more, temperature is increased to 500 to 1,000° C. at a temperature rising rate of from 0.1 to 5° C/min, followed by holding in the temperature range for from 10 to 240 minutes (holding temperature in a range of from 500 to 1,000° C. is hereinafter called a "heat treatment temperature"). By conducting the heat treatment by the heating pattern, particularly by the heat treatment temperature of from 500 to 1,000° C., a Cu—In—Ga—Se powder having a desired compound phase can be obtained, and thus, such a case is preferred. The heat treatment temperature is more preferably 700° C. or higher, and still more preferably 800° C. or higher (particularly 900° C. or higher). When holding at a temperature of 400° C. or lower is conducted for 1 hour or more in addition to the adjustment of the above heat treatment temperature, the proportion of the Cu—In—Ga—Se compound occupied in the Cu—In—Ga—Se reactant can be increased. As a result, the total amount of the Cu—In—Ga—Se compound and/or Cu—In—Se compound occupied in the Cu—In—Ga—Se powder obtained by pulverizing the reactant can be increased, and thus, such a case is preferred.

Fourth Step

In a fourth step, the Cu—In—Ga—Se reactant obtained in the third step is pulverized to obtain a Cu—In—Ga—Se powder. Pulverization can use, for example, a ball mill, and a Cu—In—Ga—Se powder of 500 μm or less can be obtained by pulverizing for from about 30 minutes to about 5 hours. With regard to the average particle size of the Cu—In—Ga—Se powder, from the standpoint of improvement in relative density of a sintered body, the lower limit is not particularly limited, and the finer the better.

The Cu—In—Ga—Se powder of the present invention obtained by the above production steps is described below.

The Cu—In—Ga—Se powder of the present invention contains a Cu—In—Ga—Se compound (quaternary compound) and/or a Cu—In—Se compound (ternary compound) in an amount of 60 mass % or more in total. Therefore, the quaternary compound and/or ternary compound may be constituted of only the quaternary compound, may be constituted by further containing the ternary compound, or may be constituted of only the ternary compound. The Cu—In—Ga—Se compound and the Cu—In—Se compound are compounds having a high melting point (about 950 to 1,050° C.). When those compounds are contained in the powder in an amount of 60 mass % or more, the melting during sintering can be suppressed, and a sintered body and a sputtering target, that are difficult to cause cracks, can be prepared. The total amount of those compounds is preferably 70 mass % or more, more preferably 90 mass % or more, and still more preferably 95 mass % or more (particularly 98 mass % or more). Examples of the Cu—In—Se compound include $CuInSe_2$ and $Cu_3In_5Se_9$, and examples of the Cu—In—Ga—Se compound include a compound in which In in the Cu—In—Se ternary compound is partially substituted with Ga, such as $Cu(In_{1-x}Ga_x)Se_2$ (wherein 0<x<1).

The Cu—In—Ga—Se powder of the present invention may contain an In—Se compound in an amount of 20 mass % or less and/or a Cu—In compound in an amount of 20 mass % or less (those are binary compounds). By containing the In—Se compound and/or the Cu—In compound to form a mixed structure with the Cu—In—Ga—Se compound and/or the Cu—In—Se compound, sinterability can further be improved. To effectively exhibit the effect, the amounts of the In—Se compound and the Cu—In compound each are preferably 1 mass % or more, and more preferably 5 mass % or more. On the other hand, when those compounds are excessively contained, sinterability may be deteriorated. For this reason, the amounts of the In—Se compound and the Cu—In compound each are preferably 20 mass % or less, more preferably 15 mass % or less, and still more preferably 10 mass % or less. Examples of the In—Se compound include InSe, $In_2Se_3$ and $In_6Se_7$, and examples of the Cu—In compound include $Cu_2In$, $Cu_4In$ and $Cu_{16}In_9$.

In order to make the Cu—In—Ga—Se powder of the present invention contain the desired compound phase and to ensure the performance of a solar cell thin film obtained by the powder, it is preferred to adjust the contents of Cu, In, Ga and Se in the powder. Specifically, when the total amount of elements of Cu, In, Ga and Se in the powder is 100 atomic %, the contents of the respective elements are preferably Cu: 20 atomic % or more and 30 atomic % or less, In: 10 atomic % or more and 25 atomic % or less, Ga: 0.1 atomic % or more and 15 atomic % or less, and Se: 40 atomic % or more and 60 atomic % or less. The contents of Cu, In, Ga and Se are preferably Cu: 23 to 27 atomic %, In: 18 to 22 atomic %, Ga: 3 to 7 atomic % and Se: 45 to 55 atomic %.

The Cu—In—Ga—Se powder of the present invention may contain binary compounds such as a Cu—Ga compound and a Cu—Se compound, in addition to the above compounds. The Cu—In—Ga—Se powder of the present invention may further contain a single phase of Cu, In, Ga or Se. However, from the standpoint of the improvement in sinterability, it is preferred that In, Ga and Se each having low melting point are not particularly contained in the form of a single phase.

By sintering the Cu—In—Ga—Se powder of the present invention, a sintered body containing elements of Cu, In, Ga and Se (hereinafter referred to as a "Cu—In—Ga—Se sintered body") can be obtained, and by machine working the Cu—In—Ga—Se sintered body, a sputtering target containing Cu, In, Ga and Se (hereinafter referred to as a "Cu—In—Ga—Se sputtering target") of the present invention can be obtained. As the machine working, a method generally used in the preparation of a sputtering target can be applied. As the sintering method, the conventional method can be applied, and, for example, a hot-pressing method can be used. The hot-pressing conditions are, for example, a pressure of 10 MPa or more, a temperature of from 400 to 600° C., and a time of from 15 minutes to 2 hours.

For the Cu—In—Ga—Se sintered body and Cu—In—Ga—Se sputtering target of the present invention thus obtained, the kind and content of compounds thereof are the same as in the Cu—In—Ga—Se powder. The reason for this is that the sintered body and sputtering target of the present invention are sintered at a temperature of preferably from 400 to 600° C. as described above, and the sintering in such a temperature range does not substantially affect the kind and content of compounds. Therefore, if the kind and content of compounds are measured in the powder of the present invention, the kind and content of compounds of the sintered body and sputtering target can directly employ the measurement results of the powder. Specifically, the sintered body and sputtering target of the present invention contain the Cu—In—Ga—Se compound and/or Cu—In—Se compound in an amount of 60 mass % or more in total. Furthermore, the sintered body and sputtering target each preferably contain an InSe compound in an amount of 20 mass % or less and/or a CuIn compound in an amount of 20 mass % or less. The preferred content of those compounds is the same as in the case of the powder described above.

In the Cu—In—Ga—Se sputtering target of the present invention, it is preferable that when an area of 0.24 mm×0.24 mm on its surface is subjected to EPMA mapping analysis, an area ratio of the In compound having the In content of 36 mass % or more is 10% or less. The EPMA mapping analysis has the advantages that macro view of segregation can be grasped and additionally, the result can be quantified. The In compound means a compound containing at least In, and does not include In single phase. Specifically, the In compound means a compound of at least one of Cu, Ga and Se, and In. The In compound having the In content of 36 mass % or more relates closely to cracks during sintering, and a sputtering target in which the In compound is excessively present has poor sinterability, resulting in cracks during sintering and processing. For this reason, the area ratio of the In compound having the In content of 36 mass % or more is preferably 10% or less, more preferably 8% or less, and still more preferably 5% or less.

The sputtering target of the present invention preferably has a relative density of 90% or more. The relative density of 90% or more enables to further increase strength of the sputtering target and can suppress cracks during sintering and processing. The relative density of the sputtering target is more preferably 95% or more, and still more preferably 98% or more. By setting the heat treatment temperature higher (more preferably 700° C. or higher, still more preferably 800° C. or higher and particularly 900° C. or higher), the melting during hot-pressing can be reduced, and the hot-pressing temperature can be increased. As a result, the relative density can be increased. The relative density is a density measured by Archimedes method as explained in Examples described hereinafter.

EXAMPLES

The present invention is described in more detail below by reference to examples. The present invention is not limited by the following examples, and can of course be carried out by appropriately adding modifications in a range capable adapting to the gist described above and described hereinafter, and those embodiments are included in the technical scope of the present invention.

Test Example 1

Cu—In—Ga alloy molten metal containing 40 atomic % of In, 10 atomic % of Ga and the remainder being Cu and unavoidable impurities was heated to 1,000° C. in an induction melting furnace. The resulting molten metal was flown out of a nozzle provided in a lower part of the induction melting furnace, and a nitrogen gas was sprayed to the flown molten metal to conduct gas atomization, thereby preparing a Cu—In—Ga powder, followed by pulverizing. In this case, an average particle size of the Cu—In—Ga powder was 45 μm. Furthermore, the Cu—In—Ga powder contained a Cu—In—Ga compound phase and an In phase.

Next, Se powder (average particle size: 2 μm) was prepared in the same amount in atomic ratio as the total amount of Cu, In and Ga. The Cu—In—Ga powder and the Se powder were mixed using a V-type mixing machine to obtain a mixed powder. The mixed powder was held at 300° C. for 120 minutes, heated to 800° C. at a temperature rising rate of 5° C/min, and held at 800° C. (heat treatment temperature) for 30 minutes to conduct a reaction, thereby obtaining Cu—In—Ga—Se reactant. The Cu—In—Ga—Se reactant obtained was pulverized by a ball mill for 30 minutes to obtain a Cu—In—Ga—Se powder having an average particle size of 150 μm. The contents of elements of Cu, In, Ga and Se in the powder obtained were Cu: 25 atomic %, In: 20 atomic %, Ga: 5 atomic % and Se: 50 atomic %, when the total amount of those elements was 100 atomic %. The Cu—In—Ga—Se powder was sintered by conducting hot-pressing under the conditions of 550° C. and 50 MPa to obtain a Cu—In—Ga—Se sintered body (110 mm diameter and 10 mm thickness). The Cu—In—Ga—Se sintered body was machine worked to obtain a sputtering target of 102 mm diameter×8 mm thickness.

Test Example 2

A Cu—In—Ga powder, a sintered body and a sputtering target were prepared in the same manner as in Test Example 1, except that the heat treatment temperature was changed to 500° C., and the hot-pressing conditions were changed to 500° C. and 60 MPa. That was used as Test Example 2.

Test Examples 3 to 5

A Cu—In—Ga—Se powder, a sintered body and a sputtering target were prepared in the same manner as in Test Example 1, except that the heat treatment temperature was changed to 600° C., 700° C. and 900° C. Those were used as Test Examples 3 to 5, respectively.

Test Examples 6 and 7

A Cu—In—Ga—Se powder were prepared in the same manner as in Test Example 1, except that the heat treatment temperature was changed to 300° C. and 400° C. Those were used as Test Examples 6 and 7, respectively.

Test Examples 1 to 7 were evaluated by the following methods. (1) Identification of Compound Phase Regarding each of the Cu—In—Ga—Se powders obtained in Test Examples 1 to 7, crystal structure analysis was conducted using an X-ray diffraction apparatus (RINT 1500 manufactured by Rigaku Corporation), and EDS analysis (energy dispersive X-ray analysis) was then conducted using a scanning electron microscope (Quanta 200FEG manufactured by FEI Japan). Thus, identification of the powder was conducted. Measurement conditions of X-ray diffraction are as follows.

Scanning rate: 2°/min
Sampling width: 0.02°
Target output: 40 kV, 200 mA
Measurement range (2θ): 15° to 100°

(2) Quantitative Determination of Compound Phase

Using the same X-ray diffraction apparatus as above, quantitative determination was conducted by Reference Intensity Ratios (RIR method).

(3) Evaluation of Sinterability

Regarding the sintered bodies obtained in Test Examples 1 to 7, the case that melting and end cracks are not observed during hot-pressing was evaluated as very excellent sinterability (◎). Furthermore, a sintered body in which melting is not observed but cracks are observed at the end even if only slightly (possible to remove by machine working) was evaluated as good sinterability (◯), and a sintered body in which melting is observed was evaluated as poor sinterability (×).

(4) Measurement of Relative Density

Relative density of each of the Cu—In—Ga—Se sputtering targets obtained in Test Examples 1 to 5 was calculated by Archimedes method.

(5) Measurement of In Compound Phase

Arbitrary area 0.24 mm×0.24 mm on the surface of each of the Cu—In—Ga—Se sputtering targets obtained in Test Examples 1 to 5 was subjected to EPMA mapping analysis for constituent elements (Cu, In, Ga and Se), and the content and area ratio of each element were measured, and the sum of area ratios of In compound containing 36 mass % or more of In was calculated. The conditions of EPMA mapping analysis are as follows.

Accelerating voltage: 15 kV
Irradiation current: $5.020 \times 10^{-8}$ A
Beam diameter: 1 μm (minimum)
Measurement time (per one point): 100 ms Number of points (X axis x Y axis): 480×480

Interval: X axis 0.5 µm, Y axis 0.5 µm

Figure 3:
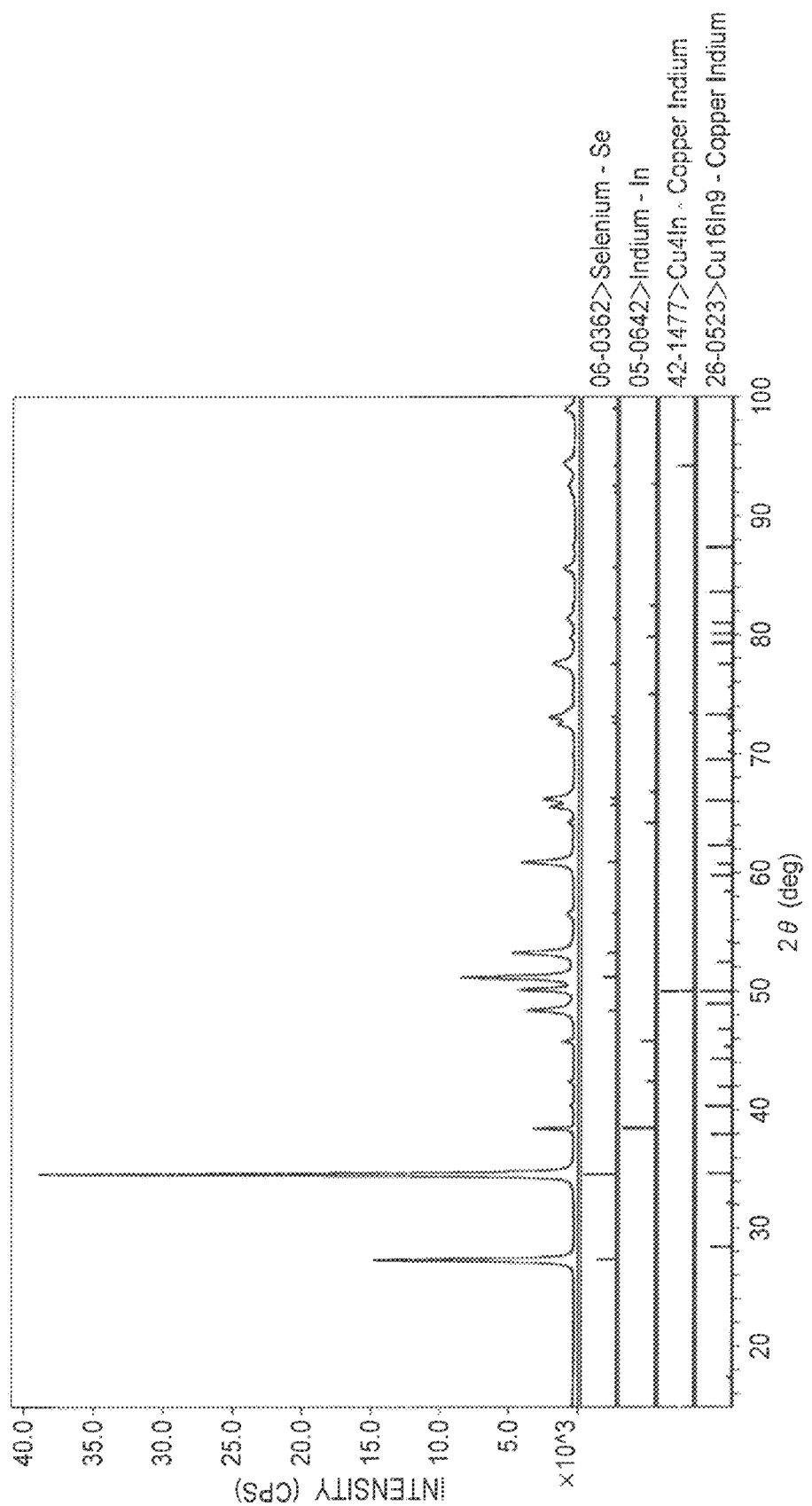
FIG. 3 is a graph showing a X-ray diffraction result of the Cu—In—Ga—Se powder of Example (Test Example 6) described hereinafter.

Measurement results of (1) to (5) above are shown in Table 1, X-ray diffraction results of the powder of Test Example 1 are shown in FIG. 1, EPMA mapping analysis results of the sputtering target of Test Example 1 are shown in FIGS. 2(a) to (f), and X-ray diffraction results of the powder of Test Example 6 are shown in FIG. 3.

TABLE 1

| Test Example No. | Heat treatment temperature (° C.) | Proportion of compound (mass %) | | | | Relative density (%) | Sinterability | Area ratio*[1] of In compound phase (%) |
|---|---|---|---|---|---|---|---|---|
| | | $Cu(In_{1-x}Ga_x)Se_2$ $CuInSe_2$ compound | Cu—In compound | In—Se compound | Others | | | |
| 1 | 800 | 97 | 1 | 2 | <1 | 98 | ⊚ | 2 |
| 2 | 500 | 74 | 10 | 16 | <1 | 91 | ○ | 9 |
| 3 | 600 | 74 | 11 | 15 | <1 | 93 | ○ | 8 |
| 4 | 700 | 92 | 2 | 6 | <1 | 95 | ⊚ | 4 |
| 5 | 900 | 98 | 1 | 1 | <1 | 99 | ⊚ | 1 |
| 6 | 300 | 27 | 8 | 8 | 57 | — | X | — |
| 7 | 400 | 42 | 4 | 9 | 45 | — | X | — |

*[1]The area ratio means area ratio of In compound phase having In content of 36 mass % or more when EPMA mapping analysis of sputtering target was conducted.

According to the method for producing the powder in Test Examples 1 to 5, a Cu—In—Ga—Se powder could safely be produced without occurrence of explosion and the like. Furthermore, because Test Examples 1 to 5 in which the heat treatment temperature is in a range of from 500 to 1,000° C. contain the Cu—In—Ga—Se compound and/or Cu—In—Se compound in an amount of 60 mass % or more, sinterability was good. Particularly, in Test Examples 1, 4 and 5 in which the heat treatment temperature was high and the proportion of the quaternary and ternary compounds was large, sinterability was improved and the relative density was further high. It was seen from FIG. 1 that the powder of Test Example 1 contains $CuGa_{0.3}In_{0.7}Se_2$, $Cu_2In$ and InSe, and it was seen from FIGS. 2(a) to (f) that in the sputtering target of Test Example 1, the area ratio of the In compound in which In content was large as 36 mass % or more was small (2%).

On the other hand, In Test Examples 6 and 7, production of a sintered body was tried by sintering each powder obtained, in the same manner as in Test Example 1. However, the powder melted during sintering, and a sintered body could not be produced. FIG. 3 shows that single phases of Se and In remain in large amount in the powder of Test Example 6. It is believed that because the heat treatment temperature in Test Example 6 was low as 300° C., Se and In remained and those single phases having low melting point melted during sintering, and as a result, a sintered body could not be produced.

While the present invention has been described in detail and with reference to specific embodiments thereof, it will be apparent to one skilled in the art that various changes and modifications can be made therein without departing from the spirit and scope thereof.

This application is based on Japanese Patent Application No. 2010-147618 filed on Jun. 29, 2010, the entire subject matters of which are incorporated herein by reference.

INDUSTRIAL APPLICABILITY

According to the production method of the present invention, a powder containing elements of Cu, In, Ga and Se can be produced without involving the danger of explosion and the like. Furthermore, in the powder of the present invention, a compound phases contained in the powder are suitably adjusted. Therefore, the sintered body and the sputtering target, each using the powder, can reduce cracks during sintering or in the course of processing.

The invention claimed is:

1. A method for producing a powder comprising Cu, In, Ga, and Se, the powder comprising 60 mass % or more in total of a Cu—In—Ga—Se compound, a Cu—In—Se compound, or both, the method comprising:

atomizing a molten metal of a Cu-based alloy comprising In and Ga to obtain a powder (1) comprising In, Ga, and Cu;

mixing a Se powder with the powder (1) to obtain a mixed powder(2);

heat-treating the mixed powder (2) at a heat treatment temperature of 500° C. -1,000° C. to obtain a reactant (3) comprising the Cu—In—Ga—Se compound, the Cu—In—Se compound, or both; and pulverizing the reactant(3) obtain the powder comprising Cu, In, Ga, and Se.

2. The method according to claim 1, wherein an average particle size of the Se powder is from 0.1 to 10 µm.

3. The method according to claim 1, wherein the powder comprising Cu, In, Ga, and Se comprises an In—Se compound in an amount of 20 mass % or less, a Cu—In compound in an amount of 20 mass % or less, or both.

4. The method according to claim 1, wherein the powder comprising Cu, in, Ga, and Se comprises, when a total amount of Cu, In, Ga, and Se in the powder is 100 atomic %;

Cu: 20 atomic % or more and 30 atomic % or less;

In: 10 atomic % or more and 25 atomic % or less;

Ga: 0.1 atomic % or more and 15 atomic % or less; and

Se: 40 atomic % or more and 60 atomic % or less.

5. The method according to claim 1, wherein atomizing a molten metal of a Cu-based alloy comprising in and Ga comprises spraying with an inert gas.

6. The method according to claim 1, wherein the powder (1) has an average particle size of 200 µm or less.

7. The method according to claim 1, wherein e powder (1) has an average particle size of 1-50 µm.

8. The method according to claim 1, wherein the powder (1) comprises a Cu—In—Ga compound and an In single phase.

9. The method according to claim 1, wherein the powder (1) comprises, based on a total amount of Cu, In, and Ga:

Cu: 40 to 60 atomic %;

In: 30 to 50 atomic %; and

Ga: 0.2 to 20 atomic %.

10. The method according to claim 1, wherein mixing the Se powder with the powder (1) comprises mixing an amount of Se such that an atomic ratio of the Se powder is equal to or greater than a total amount of Cu, In, and Ga in the powder (1).

11. The method according to claim 1, wherein the Se powder has an average particle size of 0.1-5 μm.

12. The method according to claim 1, wherein heat-treating the mixed powder (2) comprises heat-treating in an inert gas atmosphere.

13. The method according to claim 1, wherein heat-treating the mixed powder (2) comprises:
    holding at a temperature of 400° C. or lower for 30 minutes or more;
    increasing to a temperature of 500 to 1,000° C. at a rate of from 0.1 to 5° C./min; and
    holding at a temperature of 500 to 1,000° C. for 10 to 240 minutes.

14. The method according to claim 1, comprising heat-treating the mixed powder (2) at a heat treatment temperature of 700° C.-1,000° C.

15. The method according to claim 1, comprising heat-treating the mixed powder (2) at a heat treatment temperature of 900° C.-1,000° C.

16. The method according to claim 1, wherein pulverizing the reactant (3) comprises pulverizing to obtain a powder having an average particle size of 500 μm or less.

17. The method according to claim 1, wherein pulverizing the reactant (3) comprises pulverizing for a period of 30 minutes to 5 hours.

18. The method according to claim 1, wherein pulverizing the reactant (3) comprises pulverizing with a ball mill.

* * * * *